United States Patent [19]

Evans et al.

[11] Patent Number: 5,081,101

[45] Date of Patent: Jan. 14, 1992

[54] YELLOW DYE MIXTURE FOR THERMAL COLOR PROOFING

[75] Inventors: Steven Evans; Derek D. Chapman, both of Rochester, N.Y.

[73] Assignee: Eastman Kodak Company, Rochester, N.Y.

[21] Appl. No.: 676,922

[22] Filed: Mar. 28, 1991

Related U.S. Application Data

[63] Continuation-in-part of Ser. No. 606,399, Oct. 31, 1990, abandoned.

[51] Int. Cl.$^5$ .................... B41M 5/035; B41M 5/26
[52] U.S. Cl. .................... 503/227; 8/471; 428/195; 428/913; 428/914; 430/200; 430/201; 430/945
[58] Field of Search ............ 8/471; 428/195, 913, 428/914; 430/200, 201, 945; 503/227

[56] References Cited

U.S. PATENT DOCUMENTS

| | | | |
|---|---|---|---|
| 3,247,211 | 4/1966 | Weaver et al. | 260/287 |
| 3,917,604 | 11/1975 | Hoyle | 546/165 |
| 4,180,663 | 12/1979 | Frishberg | 544/105 |
| 4,866,029 | 9/1989 | Evans et al. | 503/227 |
| 4,923,846 | 5/1990 | Kutsukake et al. | 503/227 |

Primary Examiner—Bruce H. Hess
Attorney, Agent, or Firm—Harold E. Cole

[57] ABSTRACT

A yellow dye-donor element for thermal dye transfer comprises a support having thereon a dye layer comprising a mixture of yellow dyes dispersed in a polymeric binder, at least one of the yellow dyes having the formula:

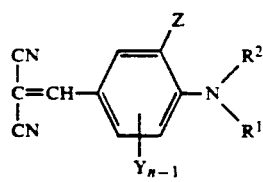

wherein:
$R^1$ is a substituted or unsubstituted alkyl group of from 1 to about 10 carbon atoms; a cycloalkyl group of from about 5 to about 7 carbon atoms; or a substituted or unsubstituted allyl group;
$R^2$ is any of the groups for $R^1$ or represents the atoms which when taken together with Z form a 5- or 6-membered ring;
Z is hydrogen; any of the groups for $R^1$; alkoxy; halogen; aryloxy; or represents the atoms which when taken together with $R^2$ forms a 5- or 6-membered ring;
Y is any of the groups for $R^1$; alkoxy of from 1 to about 10 carbon atoms; halogen; or represents the atoms necessary to complete a 5- or 6-membered ring, thus forming a fused ring system; and n is a positive integer from 1 to 3; and at least one of the other of the dyes having the formula:

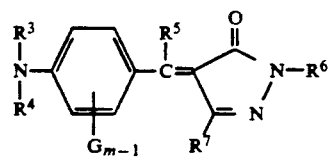

wherein:
$R^6$ represents a substituted or unsubstituted alkyl group of from 1 to about 10 carbon atoms; a cycloalkyl group of from about 5 to about 7 carbon atoms; a substituted or unsubstituted allyl group; or an aryl group having from about 6 to about 10 carbon atoms;
$R^7$ represents a substituted or unsubstituted alkoxy group having from 1 to about 10 carbon atoms; a substituted or unsubstituted aryloxy group having from about 6 to about 10 carbon atoms; $NHR^8$; $NR^8R^9$ or the atoms necessary to complete a 6-membered ring fused to the benzene ring;
$R^3$ and $R^4$ each represents any of the groups for $R^6$; or $R^3$ and $R^4$ can be joined together to form, along with the nitrogen to which they are attached, a 5- or 6-membered heterocyclic ring; or either or both of $R^3$ and $R^4$ can be joined to the carbon atom of the benzene ring at a position ortho to the position of attachment of the anilino nitrogen to form a 5- or 6-membered ring, thus forming a polycyclic system;
$R^5$ represents hydrogen; a substituted or unsubstituted alkyl group of from 1 to about 10 carbon atoms; a cycloalkyl group of from about 5 to about 7 carbon atoms; a substituted or unsubstituted allyl group; carbamoyl; or alkoxycarbonyl;
$R^8$ and $R^9$ each independently represents any of the groups for $R^6$; or $R^8$ and $R^9$ may be joined together to form, along with the nitrogen to which they are attached, a 5- or 6-membered heterocyclic ring;
m is a positive integer from 1 to 3; and
G represents a substituted or unsubstituted alkyl or alkoxy group of from 1 to about 10 carbon atoms; halogen; aryloxy; or represents the atoms necessary to complete a 5- or 6-membered ring, thus forming a fused ring system.

In a preferred embodiment of the invention, a third yellow dye is employed having the formula:

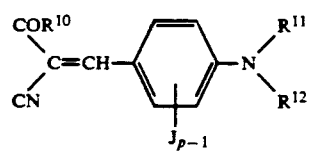

wherein:
$R^{10}$ represents $OR^{13}$ or $NHR^{13}$;
$R^{11}$ represents any of the groups for $R^4$;
$R^{12}$ represents any of the groups for $R^4$;
$R^{13}$ represents any of the groups for $R^6$;
J represents any of the groups for G; and
p is a positive integer from 1 to 3.

20 Claims, No Drawings

YELLOW DYE MIXTURE FOR THERMAL COLOR PROOFING

This application is a continuation-in-part of Ser. No. 07/606,399 (filed 10/31/90), now abandoned.

This invention relates to use of a mixture of yellow dyes in a yellow dye-donor element for thermal dye transfer imaging which is used to obtain a color proof that accurately represents the hue of a printed color image obtained from a printing press.

In order to approximate the appearance of continuous-tone (photographic) images via ink-on-paper printing, the commercial printing industry relies on a process known as halftone printing. In halftone printing, color density gradations are produced by printing patterns of dots or areas of varying sizes, but of the same color density, instead of varying the color density continuously as is done in photographic printing.

There is an important commercial need to obtain a color proof image before a printing press run is made. It is desired that the color proof will accurately represent at least the details and color tone scale of the prints obtained on the printing press. In many cases, it is also desirable that the color proof accurately represent the image quality and halftone pattern of the prints obtained on the printing press. In the sequence of operations necessary to produce an ink-printed, full-color picture, a proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, full-color picture is assembled.

Colorants that are used in the printing industry are insoluble pigments. By virtue of their pigment character, the spectrophotometric curves of the printing inks are often unusually sharp on either the bathochromic or hypsochromic side. This can cause problems in color proofing systems in which dyes as opposed to pigments are being used. It is very difficult to match the hue of a given ink using a single dye.

In U.S. patent application 514,643, filed Apr. 25, 1990, of DeBoer, a process is described for producing a direct digital, halftone color proof of an original image on a dye-receiving element. The proof can then be used to represent a printed color image obtained from a printing press. The process described therein comprises:

a) generating a set of electrical signals which is representative of the shape and color scale of an original image;

b) contacting a dye-donor element comprising a support having thereon a dye layer and an infrared-absorbing material with a first dye-receiving element comprising a support having thereon a polymeric, dye image-receiving layer;

c) using the signals to imagewise-heat by means of a diode laser the dye-donor element, thereby transferring a dye image to the first dye-receiving element; and d) retransferring the dye image to a second dye image-receiving element which has the same substrate as the printed color image.

In the above process, multiple dye-donors are used to obtain a complete range of colors in the proof. For example, for a full-color proof, four colors: cyan, magenta, yellow and black are normally used.

By using the above process, the image dye is transferred by heating the dye-donor containing the infrared-absorbing material with the diode laser to volatilize the dye, the diode laser beam being modulated by the set of signals which is representative of the shape and color of the original image, so that the dye is heated to cause volatilization only in those areas in which its presence is required on the dye-receiving layer to reconstruct the original image.

Similarly, a thermal transfer proof can be generated by using a thermal head in place of a diode laser as described in U.S. Pat. No. 4,923,846. Commonly available thermal heads are not capable of generating halftone images of adequate resolution but can produce high quality continuous tone proof images which are satisfactory in many instances. U.S. Pat. No. 4,923,846 also discloses the choice of mixtures of dyes for use in thermal imaging proofing systems. The dyes are selected on the basis of values for hue error and turbidity. The Graphic Arts Technical Foundation Research Report No. 38, "Color Material" (58-(5) 293-301, 1985 gives an account of this method.

An alternative and more precise method for color measurement and analysis uses the concept of uniform color space known as CIELAB in which a sample is analyzed mathematically in terms of its spectrophotometric curve, the nature of the illuminant under which it is viewed and the color vision of a standard observer. For a discussion of CIELAB and color measurement, see "Principles of Color Technology", 2nd Edition, p.25–110, Wiley-Interscience and "Optical Radiation Measurements", Volume 2, p.33–145, Academic Press.

In using CIELAB, colors can be expressed in terms of three parameters: $L^*$, $a^*$ and $b^*$, where $L^*$ is a lightness function, and $a^*$ and $b^*$ define a point in color space. Thus, a plot of $a^*$ v. $b^*$ values for a color sample can be used to accurately show where that sample lies in color space, i.e., what its hue is. This allows different samples to be compared for hue if they have similar density and $L^*$ values.

In color proofing in the printing industry, it is important to be able to match the proofing ink references provided by the International Prepress Proofing Association. These ink references are density patches made with standard 4-color process inks and are known as SWOP (Specifications Web Offset Publications) Color References. For additional information on color measurement of inks for web offset proofing, see "Advances in Printing Science and Technology", Proceedings of the 19th International Conference of Printing Research Institutes, Eisenstadt, Austria, June 1987, J. T. Ling and R. Warner, p. 55.

We have found that an acceptable hue match for a given sample is obtained by a mixture of dyes, if the color coordinates of the sample lie close to the line connecting the coordinates of the individual dyes. Thus, this invention relates to the use of a mixture of yellow dyes for thermal dye transfer imaging to approximate a hue match of the yellow SWOP Color Reference. While the individual dyes by themselves do not match the SWOP Color Reference, the use of a suitable mixture of dyes allows a good color space (i.e., hue) match to be achieved. In addition, the mixture of dyes described in this invention provide a closer hue match to the SWOP standard than the preferred dye of U.S. Pat. No. 4,923,846.

Accordingly, this invention relates to a yellow dye-donor element for thermal dye transfer comprising a support having thereon a dye layer comprising a mixture of yellow dyes dispersed in a polymeric binder, at least one of the dyes having the formula:

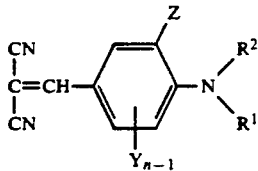

wherein:

$R^1$ is a substituted or unsubstituted alkyl group of from 1 to about 10 carbon atoms, such as methyl, ethyl, propyl, isopropyl, butyl, pentyl, hexyl or such alkyl groups substituted with hydroxy, acyloxy, alkoxy, aryloxy, aryl, cyano, acylamino, halogen, carbamoyloxy, ureido, imido, alkoxycarbonyl, etc.; a cycloalkyl group of from about 5 to about 7 carbon atoms such as cyclopentyl, cyclohexyl, p-methylcyclohexyl, etc.; or an allyl group unsubstituted or substituted with alkyl of from 1 to about 6 carbon atoms, halogen, cyano, aryl of from about 6 to about 10 carbon atoms, alkoxy, etc;

$R^2$ is any of the groups for $R^1$ or represents the atoms which when taken together with Z form a 5- or 6-membered ring;

Z is hydrogen; any of the groups for $R^1$; alkoxy of from 1 to about 10 carbon atoms such as methoxy, methoxyethoxy, t-octyloxy, etc.; halogen such as chloro, bromo or fluoro; aryloxy; or represents the atoms which when taken together with $R^2$ forms a 5- or 6-membered ring;

Y is any of the groups for $R^1$; alkoxy of from 1 to about 10 carbon atoms such as methoxy, methoxyethoxy, t-octyloxy etc.; halogen; or represents the atoms necessary to complete a 5- or 6-membered ring, thus forming a fused ring system such as naphthalene, quinoline, isoquinoline or benzothiazole; and n is a positive integer from 1 to 3; and at least one of the other of the dyes having the formula:

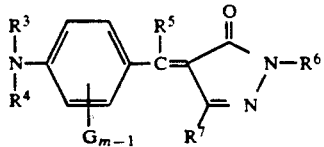

wherein:

$R^6$ represents a substituted or unsubstituted alkyl group of from 1 to about 10 carbon atoms, such as those listed above for $R^1$; a cycloalkyl group of from about 5 to about 7 carbon atoms, such as those listed above for $R^1$; an allyl group, such as those listed above for $R^1$; or an aryl group having from about 6 to about 10 carbon atoms, such as phenyl, naphthyl, p-tolyl, m-chlorophenyl, p-methoxyphenyl, m-bromophenyl, o-tolyl, etc.;

$R^7$ represents a substituted or unsubstituted alkoxy group having from 1 to about 10 carbon atoms, such as methoxy, ethoxy, methoxyethoxy or 2-cyanoethoxy; a substituted or unsubstituted aryloxy group having from about 6 to about 10 carbon atoms, such as phenoxy, m-chlorophenoxy, or naphthoxy; $NHR^8$; $NR^8R^9$ or the atoms necessary to complete a 6-membered ring fused to the benzene ring, such as O, $CH_2$, S, $NR^8$, etc;

$R^3$ and $R^4$ each represents any of the groups for $R^6$; or $R^3$ and $R^4$ can be joined together to form, along with the nitrogen to which they are attached, a 5-or 6-membered heterocyclic ring, such as a pyrrolidine or morpholine ring;

or either or both of $R^3$ and $R^4$ can be joined to the carbon atom of the benzene ring at a position ortho to the position of attachment of the anilino nitrogen to form a 5- or 6-membered ring, thus forming a polycyclic system such as 1,2,3,4-tetrahydroquinoline, julolidine, 2,3-dihydroindole, or benzomorpholine;

$R^5$ represents hydrogen; a substituted or unsubstituted alkyl group of from 1 to about 10 carbon atoms, such as those listed above for $R^1$; a cycloalkyl group of from about 5 to about 7 carbon atoms, such as those listed above for $R^1$; an allyl group, such as those listed above for $R^1$; halogen; carbamoyl, such as N,N-dimethylcarbamoyl; or alkoxycarbonyl, such as ethoxycarbonyl or methoxyethoxycarbonyl;

$R^8$ and $R^9$ each independently represents any of the groups for $R^6$, or $R^8$ and $R^9$ may be joined together to form, along with the nitrogen to which they are attached, a 5- or 6-membered heterocyclic ring, such as a pyrrolidine or morpholine ring;

m is a positive integer from 1 to 3; and

G represents a substituted or unsubstituted alkyl or alkoxy group of from 1 to about 10 carbon atoms, such as those listed above for Y; halogen; aryloxy; or represents the atoms necessary to complete a 5- or 6-membered ring, thus forming a fused ring system such as naphthalene, quinoline, isoquinoline or benzothiazole.

In a preferred embodiment of the invention, $R^2$ in the above structural formula I represents the atoms which are taken together with Z to form a 6-membered ring. In another preferred embodiment of the invention, $R^1$ is $C_2H_4OCONHC_6H_5$.

In another preferred embodiment of the invention, in formula II, $R^6$ is phenyl; $R^7$ is ethoxy or $NHR^8$, wherein $R^8$ is methyl or phenyl; m is 1; and $R^5$ is hydrogen.

In another preferred embodiment, $R^7$ is O and completes a 6-membered ring fused to the benzene ring. In another preferred embodiment, $R^7$ is $NR^8R^9$, wherein each $R^8$ and $R^9$ is methyl or $R^8$ is ethyl and $R^9$ is phenyl.

In another preferred embodiment, $R^7$ is $NR^8R^9$, wherein $R^8$ and $R^9$ are joined together to form, along with the nitrogen to which they are attached, a pyrrolidine or morpholine ring.

In still another preferred embodiment, $R^3$ is methyl, ethyl or butyl and $R^4$ is methyl, ethyl, butyl or $CH_2CO_2CH_2CF_3$. In yet still another preferred embodiment, $R^3$ and $R^4$ are joined together to form a pyrrolidine ring.

In another preferred embodiment in formulas I and II, Y is methyl, n is 2, Z and $R^2$ form a 6-membered ring, $R^1$ is $CH_2CH_2O_2CNHC_6H_5$, $R^3$ and $R^4$ are each $C_2H_5$, $R^5$ is hydrogen, $R^6$ is $C_6H_5$, $R^7$ is $N(CH_3)_2$ and m is 1.

In still another preferred embodiment, Y is methyl, n is 2, Z and $R^2$ form a 6-membered ring, $R^1$ is $C_2H_5$, $R^3$ and $R^4$ are each $C_2H_5$, $R^5$ is hydrogen, $R^6$ is $C_6H_5$, $R^7$ is $N(CH_3)_2$ and m is 1.

In yet still another preferred embodiment, Y is methyl, n is 2, Z is hydrogen, $R^1$ is $C_2H_5$, $R^2$ is $C_2H_4O_2CNHC_6H_5$, $R^3$ and $R^4$ are each $C_2H_5$, $R^5$ is hydrogen, $R^6$ is $C_6H_5$, $R^7$ is $N(CH_3)_2$ and m is 1.

In still another preferred embodiment, Y is methyl, n is 2, Z and $R^2$ form a 6-membered ring, $R^1$ is $CH_2CH_2O_2CNHC_6H_5$, $R^3$ is $C_2H_5$, $R^4$ is $CH_2C_6H_5$, G is methyl, $R^5$ is hydrogen, $R^6$ is $C_6H_5$, $R^7$ is $OC_2H_5$ and m is 2.

In yet still another preferred embodiment, Y is methyl, n is 2, Z and $R^2$ form a 6-membered ring, $R^1$ is $CH_2CH_2O_2CNHC_6H_5$, $R^3$ and $R^4$ are each $C_2H_5$, $R^5$ is hydrogen, $R^6$ is $C_6H_5$, $R^7$ is $OC_3H_7$-i, and m is 1.

In another preferred embodiment of the invention, a third yellow dye is employed having the formula:

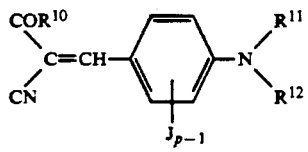
III wherein:
$R^{10}$ represents $OR^{13}$ or $NHR^{13}$;
$R^{11}$ represents any of the groups for $R^3$;
$R^{12}$ represents any of the groups for $R^4$;
$R^{13}$ represents any of the groups for $R^6$;
J represents any of the groups for G; and
p is a positive integer from 1 to 3.

The compounds of formula I employed in the invention above may be prepared by any of the processes disclosed in U.S. Pat. Nos. 3,917,604, 4,180,663 and 3,247,211, the disclosures of which are hereby incorporated by reference.

The compounds of formula II employed in the invention above may be prepared by any of the processes disclosed in U.S. Pat. No. 4,866,029, the disclosure of which is hereby incorporated by reference.

Compounds included within the scope of formula I above include the following:

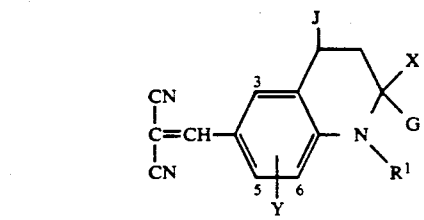

| Cmpd | Y | J | G | X | $R^1$ |
|---|---|---|---|---|---|
| A | 5-$CH_3$ | $CH_3$ | $CH_3$ | $CH_3$ | $C_2H_4OCONHC_6H_5$ |
| B | H | $CH_3$ | $CH_3$ | $CH_3$ | $C_2H_4OCONHC_6H_5$ |
| C | 5-$CH_3$ | H | $CH_3$ | H | $C_2H_4OCONHC_6H_5$ |
| D | 3-$CH_3$ 6-$OCH_3$ | H | $CH_3$ | H | $C_2H_4OCONHC_6H_5$ |
| E | 5-$CH_3$ | $CH_3$ | $CH_3$ | $CH_3$ | $CH_2CH(CH_3)OCONHC_6H_5$ |
| F | 5-$CH_3$ | $CH_3$ | $CH_3$ | $CH_3$ | $CH_2CH(O_2CCH_3)CH_2O_2CCH_3$ |
| G | 5-$CH_3$ | $CH_3$ | $CH_3$ | $CH_3$ | $CH_2CH(OCONHC_2H_5)CH_2OCONHC_2H_5$ |
| H | 5-$CH_3$ | $CH_3$ | $CH_3$ | $CH_3$ | $(CH_2)_3NHCONHC_6H_5$ |
| I | 5-$CH_3$ | $CH_3$ | $CH_3$ | $CH_3$ | $(CH_2)_3NHCOOC_2H_5$ |
| J | 5-$CH_3$ | $CH_3$ | $CH_3$ | $CH_3$ | $(CH_2)_2O_2CC_6H_4$-4-$CO_2CH_3$ |
| K | 5-Cl | H | $CH_3$ | H | $(CH_2)_2OCONHC_6H_4$-4-Cl |
| L | 5-$CH_3$ | H | $CH_3$ | H | $CH_2CH(O_2CC_2H_5)CH_2O_2CC_2H_5$ |
| M | 5-$CH_3$ | H | $CH_3$ | H | $(CH_2)_2NHCOC_6H_5$ |
| N | 5-$CH_3$ | $CH_3$ | $CH_3$ | $CH_3$ | $C_2H_5$ |
| O | 5-$CH_3$ | $CH_3$ | $CH_3$ | $CH_3$ | $(CH_2)_2O_2CCH_2OC_6H_5$ |
| P | 3-$CH_3$ 6-$OCH_3$ | $CH_3$ | $CH_3$ | $CH_3$ | $C_2H_4C_6H_5$ |
| Q | 3-$CH_3$ 6-$OCH_3$ | $CH_3$ | $CH_3$ | $CH_3$ | $CH_2C_6H_5$ |
| R | 3-$CH_3$ 6-$OCH_3$ | $CH_3$ | $CH_3$ | $CH_3$ | $(CH_2)_2N(CH_3)(SO_2C_6H_5)$ |
| S | 5-$CH_3$ | $CH_3$ | $CH_3$ | $CH_3$ | 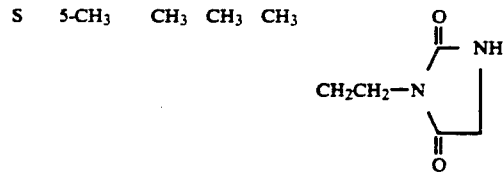 |
| T | 5-$CH_3$ | $CH_3$ | $CH_3$ | $CH_3$ | $C_2H_4OC_6H_5$ |

U

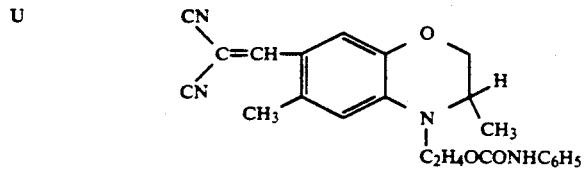

-continued
V 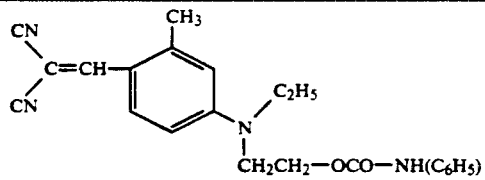
W 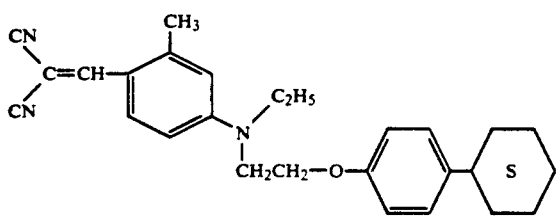
X 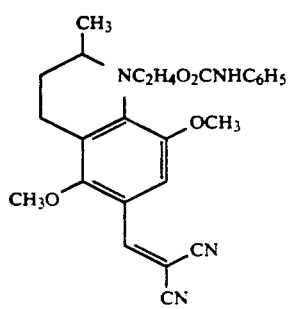
| COMPOUND | R¹ | R² |
|---|---|---|
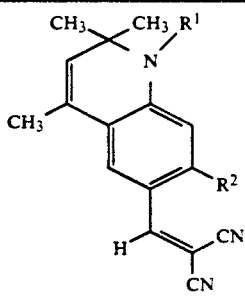
| | | |
|---|---|---|
| Y | $CH_2C_6H_5$ | $CH_3$ |
| Z | $C_2H_4O_2CNHC_6H_5$ | H |
| AA | $C_2H_4O_2CNHC_6H_5$ | $CH_3$ |
| BB | $C_2H_4O_2CNHC_6H_4$-m-$CH_3$ | $CH_3$ |
| CC | $C_2H_4O_2CNHC_4H_9$-n | $CH_3$ |
| DD | $C_2H_4O_2CNH$-c-$C_6H_{11}$ | $CH_3$ |
| EE | $C_2H_5$ | H |
| FF | $C_2H_4O_2CCH_3$ | $OCH_3$ |
| GG | n-$C_4H_9$ | Cl |
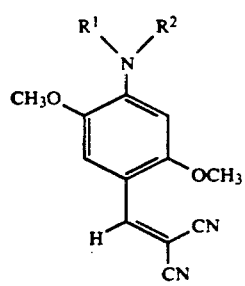
| | | |
|---|---|---|
| HH | i-$C_3H_7$ | $C_2H_4O_2CNHC_6H_5$ |
| II | s-$C_4H_9$ | $C_2H_4O_2CNHC_6H_5$ |
| JJ | i-$C_3H_7$ | $C_2H_4O_2CNHC_6H_4$-m-$CH_3$ |
| KK | i-$C_3H_7$ | $C_2H_4O_2CNH$-n-$C_4H_9$ |
| LL | i-$C_3H_7$ | $C_2H_4O_2CNH$-c-$C_6H_{11}$ |
| MM | c-$C_6H_{11}$ | $C_2H_4O_2CNHC_6H_5$ |
| NN | $C_2H_5$ | $C_2H_5$ |
| OO | i-$C_3H_7$ | $C_3H_6C_6H_5$ |

-continued

| | | |
|---|---|---|
| PP | $C_2H_5$ | $CH(CH_3)C_2H_4O_2CNHC_6H_5$ |
| QQ | $i-C_3H_7$ | $C_2H_4CO_2C_2H_5$ |
| RR | $C_2H_5$ | $C_2H_4O_2CCH_3$ |
| SS | $n-C_4H_9$ | $n-C_4H_9$ |
| TT | $n-C_6H_{13}$ | $n-C_6H_{13}$ |
| UU | $n-C_8H_{17}$ | $n-C_8H_{17}$ |

Compounds included within the scope of formula II above include the following:

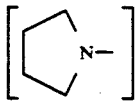

| Cmpd. | G | $R^3$ | $R^4$ | $R^5$ | $R^6$ | $R^7$ |
|---|---|---|---|---|---|---|
| 1 | H | $C_2H_5$ | $C_2H_5$ | H | $C_6H_5$ | $N(CH_3)_2$ |
| 2 | H | $CH_3$ | $CH_3$ | H | $C_6H_5$ | $N(CH_3)_2$ |
| 3 | H | $n-C_4H_9$ | $n-C_4H_9$ | H | $C_6H_5$ | $N(CH_3)_2$ |
| 4 | $3-CH_3$ | $C_2H_5$ | $CF_3CH_2O_2CCH_2$ | H | $C_6H_5$ | $N(CH_3)_2$ |
| 5 | H |  | | H | $C_6H_5$ | $N(CH_3)_2$ |
| 6 | H | $C_2H_5$ | $C_2H_5$ | H | $C_6H_5$ | $NHC_6H_5$ |
| 7 | H | $C_2H_5$ | $C_2H_5$ | H | $C_6H_5$ | 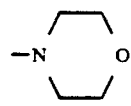 |
| 8 | H | $C_2H_5$ | $C_2H_5$ | H | $C_6H_5$ | 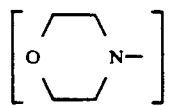 |
| 9 | H | $C_2H_5$ | $C_2H_5$ | H | $C_6H_5$ | $NHCH_3$ |
| 10 | H | $C_2H_5$ | $C_2H_5$ | H | $C_6H_5$ | $N(C_2H_5)-(C_6H_5)$ |
| 11 | $3-OCH_3$ | $C_2H_5$ | $C_2H_5$ | H | $C_6H_5$ | $N(CH_3)_2$ |
| 12 | H | $n-C_4H_9$ | $n-C_4H_9$ | H | $C_6H_5$ | $OC_2H_5$ |
| 13 | 3-Cl | $CH_3$ | $C_2H_5O_2CCH_2$ | H | $C_{10}H_9$ | $N(CH_3)_2$ |
| 14 | H | 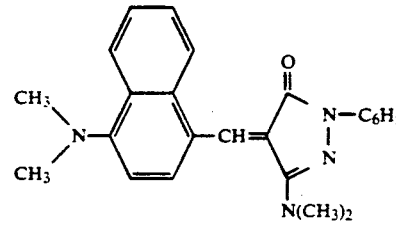 | | H | $4-Cl-C_6H_4$ | $OCH_3$ |
| 15 | $3-CH_3$ | $ClC_2H_4$ | $ClC_2H_4$ | H | $CH_2C_6H_5$ | $OC_6H_5$ |
| 16 | $3-C_2H_5$ | $C_6H_5CH_2$ | $C_2H_5$ | H | $CH_3$ | $N(CH_3)_2$ |
| 17 | $2,5-(OCH_3)_2$ | $CH_3$ | $CH_3$ | H | $3,5(Cl)_2-C_6H_3$ | $NHCH_3$ |
| 18 | H | $CH_3$ | $CH_3$ | $CO_2C_2H_5$ | $C_6H_5$ | $N(CH_3)_2$ |
| 19 | H | $CH_3$ | $CH_3$ | Cl | $C_6H_5$ | $N(CH_3)_2$ |
| 20 | $3-CH_3$ | $C_2H_5$ | $C_6H_5CH_2$ | H | $C_6H_5$ | $OC_2H_5$ |
| 21 | H | $C_2H_5$ | $C_2H_5$ | H | $C_6H_5$ | $OC_3H_7-i$ |

22

-continued
23 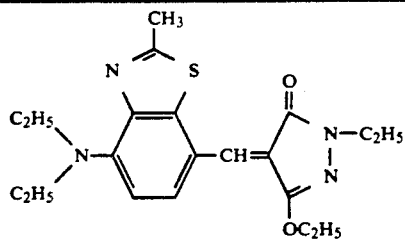
24 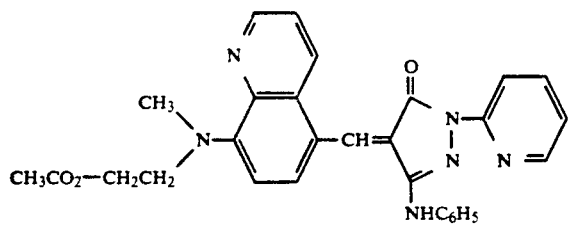
25 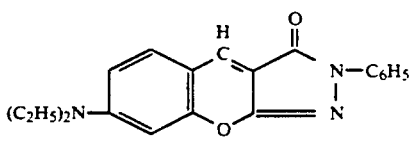
26 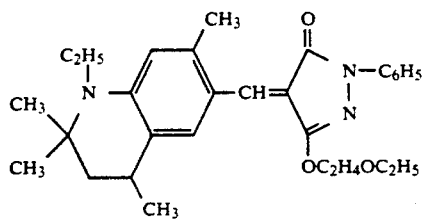
27 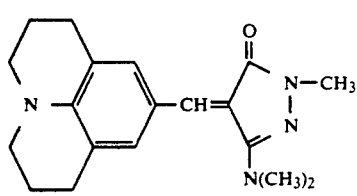
28 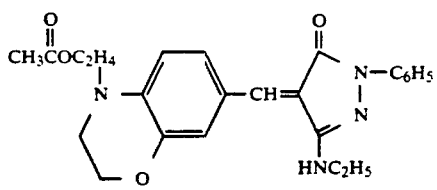
29 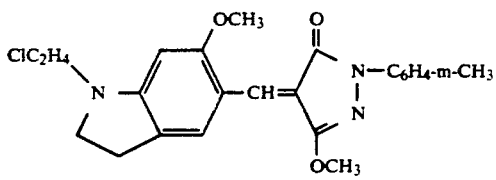
As noted above, in a preferred embodiment of the invention, a third yellow dye may be employed. Compounds included within the scope of formula III above include:

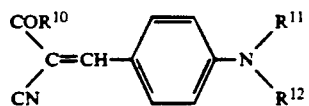

| COMPOUND | $R^{11}$ | $R^{12}$ | $R^{10}$ |
|---|---|---|---|
| a | $C_2H_5$ | $C_2H_5$ | $NHCH_2C_6H_5$ |
| b | $C_2H_5$ | $CH_2C_6H_5$ | $NHCH_2C_6H_5$ |
| c | $C_2H_5$ | $CH_2CO_2C_2H_5$ | $NHCH_2C_6H_5$ |
| d | $C_4H_9$ | $C_4H_9$ | $NHCH_2C_6H_5$ |
| e | $C_2H_5$ | $CH_2CO_2C_2H_5$ | $NHC_6H_5$ |
| f | $CH_3$ | $CH_3$ | $NHC_6H_5$ |
| g | $CH_2CO_2\text{-i-}C_3H_7$ | $CH_2CO_2\text{-i-}C_3H_7$ | $NHC_6H_5$ |
| h | $C_2H_5$ | $C_2H_5$ | $NHC_2H_4OCH_3$ |
| i | $C_2H_5$ | $CH_2C_6H_5$ | $NHC_2H_4OCH_3$ |
| j | $C_2H_5$ | $CH_2CO_2C_2H_5$ | $NHC_2H_4OCH_3$ |
| k | $C_4H_9$ | $C_4H_9$ | $NHC_2H_4OCH_3$ |
| l | $CH_2CO_2\text{-i-}C_3H_7$ | $CH_2CO_2\text{-i-}C_3H_7$ | $OC_2H_5$ |
| m | $C_4H_9$ | $C_4H_9$ | $OC_2H_5$ |

The use of dye mixtures in the dye-donor of the invention permits a wide selection of hue and color that enables a closer hue match to a variety of printing inks and also permits easy transfer of images one or more times to a receiver if desired. The use of dyes also allows easy modification of image density to any desired level. The dyes of the dye-donor element of the invention may be used at a coverage of from about 0.05 to about 1 g/m².

The dyes in the dye-donor of the invention are dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; a polycarbonate; polyvinyl acetate; poly(styrene-co-acrylonitrile); a poly(sulfone) or a poly(phenylene oxide). The binder may be used at a coverage of from about 0.1 to about 5 g/m².

The dye layer of the dye-donor element may be coated on the support or printed thereon by a printing technique such as a gravure process.

Any material can be used as the support for the dye-donor element of the invention provided it is dimensionally stable and can withstand the heat of the laser or thermal head. Such materials include polyesters such as poly(ethylene terephthalate); polyamides; polycarbonates; cellulose esters such as cellulose acetate; fluorine polymers such as polyvinylidene fluoride or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. It may also be coated with a subbing layer, if desired, such as those materials described in U.S. Pat. Nos. 4,695,288 or 4,737,486.

The reverse side of the dye-donor element may be coated with a slipping layer to prevent the printing head from sticking to the dye-donor element. Such a slipping layer would comprise either a solid or liquid lubricating material or mixtures thereof, with or without a polymeric binder or a surface active agent. Preferred lubricating materials include oils or semi-crystalline organic solids that melt below 100° C. such as poly(vinyl stearate), beeswax, perfluorinated alkyl ester polyethers, poly(capro-lactone), silicone oil, poly(tetrafluoroethylene), carbowax, poly(ethylene glycols), or any of those materials disclosed in U.S. Pat. Nos. 4,717,711; 4,717,712; 4,737,485; and 4,738,950. Suitable polymeric binders for the slipping layer include poly(vinyl alcohol-co-butyral), poly(vinyl alcohol-co-acetal), poly(styrene), poly(vinyl acetate), cellulose acetate butyrate, cellulose acetate propionate, cellulose acetate or ethyl cellulose.

The amount of the lubricating material to be used in the slipping layer depends largely on the type of lubricating material, but is generally in the range of about 0.001 to about 2 g/m². If a polymeric binder is employed, the lubricating material is present in the range of 0.1 to 50 weight %, preferably 0.5 to 40, of the polymeric binder employed.

The dye-receiving element that is used with the dye-donor element of the invention usually comprises a support having thereon a dye image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the dye-receiving element may also be reflective such as baryta-coated paper, polyethylene-coated paper, an ivory paper, a condenser paper or a synthetic paper such as duPont Tyvek ®. Pigmented supports such as white polyester (transparent polyester with white pigment incorporated therein) may also be used.

The dye image-receiving layer may comprise, for example, a polycarbonate, a polyurethane, a polyester, polyvinyl chloride, poly(styrene-co-acrylonitrile), poly(capro-lactone), a poly(vinyl acetal) such as poly(vinyl alcohol-co-butyral), poly(vinyl alcohol-co-benzal), poly(vinyl alcohol-co-acetal) or mixtures thereof. The dye image-receiving layer may be present in any amount which is effective for the intended purpose. In general, good results have been obtained at a concentration of from about 1 to about 5 g/m².

As noted above, the dye-donor elements of the invention are used to form a dye transfer image. Such a process comprises imagewise-heating a dye-donor element as described above and transferring a dye image to a dye-receiving element to form the dye transfer image.

The dye-donor element of the invention may be used in sheet form or in a continuous roll or ribbon. If a continuous roll or ribbon is employed, it may have only the yellow dyes thereon as described above or may have alternating areas of other different dyes or combinations, such as sublimable cyan and/or magenta and/or black or other dyes. Such dyes are disclosed in U.S. Pat. Nos. 4,541,830, the disclosure of which is hereby incorporated by reference. Thus, one-, two-, three- or four-color elements (or higher numbers also) are included within the scope of the invention.

Thermal printing heads which can be used to transfer dye from the dye-donor elements of the invention are available commercially. There can be employed, for example, a Fujitsu Thermal Head (FTP-040 MCS001), a TDK Thermal Head F415 HH7-1089 or a Rohm Thermal Head KE 2008-F3.

A laser may also be used to transfer dye from the dye-donor elements of the invention. When a laser is used, it is preferred to use a diode laser since it offers substantial advantages in terms of its small size, low cost, stability, reliability, ruggedness, and ease of modulation. In practice, before any laser can be used to heat a dye-donor element, the element must contain an infrared-absorbing material, such as carbon black, cyanine infrared absorbing dyes as described in DeBoer Application Ser. No. 463,095, filed Jan. 10, 1990, or other materials as described in U.S. application Ser. Nos.: 367,062, 367,064, 367,061 and 369,492 and U.S. Pat. Nos. 4,948,777, 4,950,640, 4,950,639, 4,948,776, 4,948,778, 4,942,141, 4,952,552 and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat.

Lasers which can be used to transfer dye from dye-donors employed in the invention are available commercially. There can be employed, for example, Laser Model SDL-2420-H2 from Spectra Diode Labs, or Laser Model SLD 304 V/W from Sony Corp.

A thermal printer which uses the laser described above to form an image on a thermal print medium is described and claimed in copending U.S. application Ser. No. 451,656 of Baek and DeBoer, filed Dec. 18, 1989, the disclosure of which is hereby incorporated by reference.

Spacer beads may be employed in a separate layer over the dye layer of the dye-donor in the above-described laser process in order to separate the dye-donor from the dye-receiver during dye transfer, thereby increasing the uniformity and density of the transferred image. That invention is more fully described in U.S. Pat. No. 4,772,582, the disclosure of which is hereby incorporated by reference. Alternatively, the spacer beads may be employed in the receiving layer of the dye-receiver as described in U.S. Pat. No. 4,876,235, the disclosure of which is hereby incorporated by reference. The spacer beads may be coated with a polymeric binder if desired.

The use of an intermediate receiver with subsequent retransfer to a second receiving element may also be employed in the invention. A multitude of different substrates can be used to prepare the color same substrate used for the printing press run. Thus, this one intermediate receiver can be optimized for efficient dye uptake without dye-smearing or crystallization.

Examples of substrates which may be used for the second receiving element (color proof) include the following: Flo Kote Cove ® (S. D. Warren Co.), Champion Textweb ® (Champion Paper Co.), Quintessence Gloss ® (Potlatch Inc.), Vintage Gloss ® (Potlatch Inc.), Khrome Kote ® (Champion Paper Co.), Ad-Proof Paper ® (Appleton Papers, Inc.), Consolith Gloss ® (Consolidated Papers Co.) and Mountie Matte ® (Potlatch Inc.).

As noted above, after the dye image is obtained on a first dye-receiving element, it is retransferred to a second dye image-receiving element. This can be accomplished, for example, by passing the two receivers between a pair of heated rollers. Other methods of retransferring the dye image could also be used such as using a heated platen, use of pressure and heat, external heating, etc.

Also as noted above, in making a color proof, a set of electrical signals is generated which is representative of the shape and color of an original image. This can be done, for example, by scanning an original image, filtering the image to separate it into the desired additive primary colors-red, blue and green, and then converting the light energy into electrical energy. The electrical signals are then modified by computer to form the color separation data which is used to form a halftone color proof. Instead of scanning an original object to obtain the electrical signals, the signals may also be generated by computer. This process is described more fully in Graphic Arts Manual, Janet Field ed., Arno Press, New York 1980 (p. 358ff), the disclosure of which is hereby incorporated by reference.

A thermal dye transfer assemblage of the invention comprises a) a dye-donor element as described above, and b) a dye-receiving element as described above, the dye-receiving element being in a superposed relationship with the dye-donor element so that the dye layer of the donor element is in contact with the dye image-receiving layer of the receiving element.

The above assemblage comprising these two elements may be preassembled as an integral unit when a monochrome image is to be obtained. This may be done by temporarily adhering the two elements together at their margins. After transfer, the dye-receiving element is then peeled apart to reveal the dye transfer image.

When a three-color image is to be obtained, the above assemblage is formed three times using different dye-donor elements. After the first dye is transferred, the elements are peeled apart. A second dye-donor element (or another area of the donor element with a different dye area) is then brought in register with the dye-receiving element and the process repeated. The third color is obtained in the same manner.

The following examples are provided to illustrate the invention.

EXAMPLE 1

Individual yellow dye-donor elements were prepared by coating on a 100 μm poly(ethylene terephthalate) support:

1) a subbing layer of poly(acrylonitrile-co-vinylidene chloride-co-acrylic acid) (0.054 g/m$^2$) (14:79:7 wt. ratio); and 2) a dye layer containing a mixture of the yellow dyes identified below and illustrated above, (total coverage 0.27 g/m$^2$) and the cyanine infrared absorbing dye illustrated below (0.054 g/m$^2$) in a cellulose acetate propionate binder (2.5% acetyl, 45% propionyl) (0.27 g/m$^2$) coated from dichloromethane.

Comparison dye-donors using the individual yellow dyes of the mixture and a control dye-donor with a single yellow dye identified below, each at 0.27 g/m$^2$, were also prepared.

Cyanine Infrared Absorbing Dye

-continued

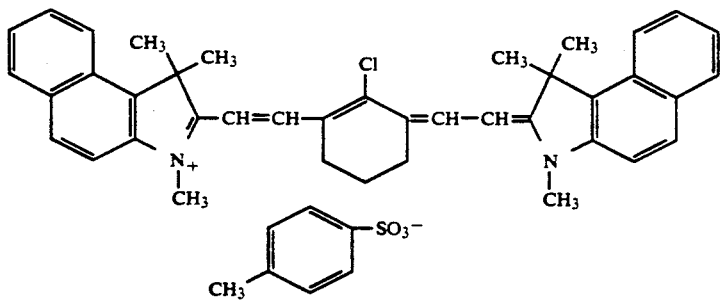

An intermediate dye-receiving element was prepared by coating on an unsubbed 100 μm thick poly(ethylene terephthalate) support a layer of crosslinked poly(styrene-co-divinylbenzene) beads (14 micron average diameter) (0.11 g/m²), triethanolamine (0.09 g/m²) and DC-510 ® Silicone Fluid (Dow Corning Company) (0.01 g/m²) in a Butvar ® 76 binder, a poly(vinyl alcohol-co-butyral), (Monsanto Company) (4.0 g/m²) from 1,1,2-trichloroethane or dichloromethane.

Single color images were printed as described below from dye-donors onto a receiver using a laser imaging device as described in U.S. Pat. No. 4,876,235. The laser imaging device consisted of a single diode laser connected to a lens assembly mounted on a translation stage and focused onto the dye-donor layer.

The dye-receiving element was secured to the drum of the diode laser imaging device with the receiving layer facing out. The dye-donor element was secured in face-to-face contact with the receiving element.

The diode laser used was a Spectra Diode Labs No. SDL-2430-H2, having an integral, attached optical fiber for the output of the laser beam, with a wavelength of 816 nm and a nominal power output of 250 milliwatts at the end of the optical fiber. The cleaved face of the optical fiber (100 microns core diameter) was imaged onto the plane of the dye-donor with a 0.33 magnification lens assembly mounted on a translation stage giving a nominal spot size of 33 microns and a measured power output at the focal plane of 115 milliwatts.

The drum, 312 mm in circumference, was rotated at 500 rpm and the imaging electronics were activated. The translation stage was incrementally advanced across the dye-donor by means of a lead screw turned by a microstepping motor, to give a center-to-center line distance of 14 microns (714 lines per centimeter, or 1800 lines per inch). For a continuous tone stepped image, the current supplied to the laser was modulated from full power to 16% power in 4% increments.

After the laser had scanned approximately 12 mm, the laser exposing device was stopped and the intermediate receiver was separated from the dye donor. The intermediate receiver containing the stepped dye image was laminated to Ad-Proof Paper ® (Appleton Papers, Inc.) 60 pound stock paper by passage through a pair of rubber rollers heated to 120° C. The polyethylene terephthalate support was then peeled away leaving the dye image and polyvinyl alcohol-co-butyral firmly adhered to the paper. The paper stock was chosen to represent the substrate used for a printed ink image obtained from a printing press.

The Status T density of each of the stepped images was read using an X-Rite ® 418 Densitometer to find the single step image within 0.05 density unit of the SWOP Color Reference. For the yellow standard, this density was 1.0.

The a* and b* values of the selected step image of transferred dye or dye-mixture was compared to that of the SWOP Color Reference by reading on an X-Rite ® 918 Colorimeter set for D50 illuminant and a 10 degree observer. The L* reading was checked to see that it did not differ appreciably from the reference. The a* and b* readings were recorded and the distance from the SWOP Color Reference calculated as the square root of the sum of differences squared for a* and b*:

$$\text{i.e.} \sqrt{(a^*_e - a^*_s)^2 + (b^*_e - b^*_s)^2}$$

$e$ = experiment (transferred dye)
$s$ = SWOP Color Reference

The following results were obtained:

TABLE 1

| Dye(s) (Wt. Ratio) | a* | b* | Distance From Reference |
| --- | --- | --- | --- |
| SWOP | 2.3 | 84.8 | — |
| A | −2.5 | 97.3 | 13 |
| A/1 (60:40) | 3.4 | 85.4 | 1 |
| A/1 (80:20) | 1.8 | 89.8 | 5 |
| A/1 (40:60) | 5.5 | 84.1 | 4 |
| 1 | 7.2 | 79.1 | 8 |
| N | −1.9 | 93.2 | 9 |
| N/1 (80:20) | −0.4 | 90.2 | 6 |
| N/1 (50:50) | 1.7 | 82.9 | 2 |
| 1 | 7.2 | 79.1 | 8 |
| V | −3.5 | 96.1 | 13 |
| V/1 (80:20) | 1.9 | 93.7 | 9 |
| V/1 (60:40) | 2.7 | 87.2 | 2 |
| 1 | 7.2 | 79.1 | 8 |
| W | −2.0 | 101.0 | 18** |
| W/1 (60:40) | 3.5 | 88.3 | 4 |
| 1 | 7.2 | 79.1 | 8 |
| A | −2.5 | 97.3 | 13 |
| A/20 (80:20) | 2.6 | 87.6 | 3 |
| 20 | 12 | 91.3 | 12 |
| A | −2.5 | 97.3 | 13 |
| A/21 (80:20) | 2.6 | 91.3 | 7 |
| 21 | 8.5 | 80.0 | 8 |
| Control* | −0.9 | 98.6 | 14 |

*U.S. Pat. No. 4,923,846, Table C-2 (Example C-2), Foron Brilliant Yellow S-6GL having the following structure:

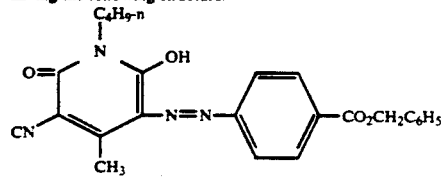

**Because dye W is very hypsochromic compared to the reading filter of the colorimeter, the drum rotation had to be adjusted to 400 rpm to increase dye transfer density to match the SWOP Color Reference.

The above results indicate that by using a mixture of the dyes according to the invention in an appropriate ratio, a hue closely corresponding to that of the yellow SWOP Color Reference was obtained, in comparison to either the control of the prior art or the individual yellow dye images which were much further away from the SWOP Color Reference.

EXAMPLE 2

Individual yellow dye-donor elements were prepared by coating on a 6 μm poly(ethylene terephthalate) support:

1) a subbing layer of Tyzor TBT ®, a titanium tetra-n-butoxide, (duPont Company) (0.16 g/m$^2$) coated from 1-butanol; and 2) a dye layer containing a mixture of the yellow dyes identified below and illustrated above, (total coverage 0.16 g/m$^2$) and FC-431 ® fluorocarbon surfactant (3M Company) (0.01 g/m$^2$) in a cellulose acetate propionate binder (2.5% acetyl, 45% propionyl) (0.27 g/m$^2$) coated from butanone.

On the back side of the dye-donor element was coated:

1) a subbing layer of Tyzor TBT ®, a titanium tetra-n-butoxide, (duPont Company) (0.16 g/m$^2$) coated from 1-butanol; and 2) a slipping layer of Emralon 329 ®, a dry film lubricant of poly(tetrafluoroethylene) particles, (Acheson Colloids Co.) (0.54 g/m$^2$) coated from a n-propyl acetate, toluene, isopropyl alcohol and n-butyl alcohol solvent mixture.

Comparison dye-donors using the individual yellow dyes of the mixture and a control dye-donor with a single yellow dye identified below, each at 0.16 g/m$^2$, were also prepared.

A dye-receiving element consisting of a laminated polymeric overlayer on a paper support was prepared by first coating on an unsubbed 100 μm thick poly(ethylene terephthalate) support a layer of crosslinked poly(styrene-co-divinylbenzene) beads (12 micron average diameter) (0.11 g/m$^2$), triethanolamine (0.09 g/m$^2$) and DC-510 ® Silicone Fluid (Dow Corning Company) (0.01 g/m$^2$) in a Butvar ® 76 binder, a poly(vinyl alcohol-co-butyral), (Monsanto Company) (4.0 g/m$^2$) coated from a 1,1,2-trichloroethane or dichloromethane solvent mixture.

This coating was laminated to Ad-Proof ® (Appleton Paper) (60 pound) paper stock by a single passage through a set of heated moving rollers at 120° C. (polymer-coated side in contact with paper stock). The poly(ethylene terephthalate) support was peeled off and discarded leaving an overlayer of poly(vinyl alcohol-co-butyral) on one side of the paper stock. The paper stock was chosen to represent the substrate used for a printed ink image obtained from a printing press.

The dye side of the dye-donor element approximately 9 cm × 12 cm in area was placed in contact with the polymeric overlayer side of the dye-receiver element of the same area. The assemblage was fastened to the top of a motor-driven 60 mm diameter rubber roller and a TDK Thermal Head L-133 (No. 8B0796), thermostatted at 26° C., was pressed with a spring at a force of 36 Newtons against the dye-donor element side of the assemblage pushing it against the rubber roller.

The imaging electronics were activated and the assemblage was drawn between the printing head and roller at 6.9 mm/sec. Coincidentally, the resistive elements in the thermal print head were pulsed at 128 μsec intervals (29 μsec/pulse) during the 33 msec/dot printing time. The voltage supplied to the print head was approximately 24 v resulting in an instantaneous peak power of approximately 1.2 watts/dot and a maximum total energy of 9.0 mjoules/dot. A stepped density image was generated by incrementally increasing the pulses/dot through a defined range to a maximum of 255.

After printing, the donor element was separated from the receiving element and the Status T density of each of the stepped images was read using an X-Rite ® 418 Densitometer to find the single step image within 0.05 density unit of the SWOP Color Reference. For the yellow standard, this density was 1.0.

The a* and b* values were measured and the distances from the SWOP Color Reference were then calculated as described in Example 1. The following results were obtained:

TABLE 2

| Dye(s) (Wt. Ratio) | a* | b* | Distance From Reference |
|---|---|---|---|
| SWOP | 2.3 | 84.8 | — |
| A | −2.6 | 99.8 | 13 |
| A/1 (60:40) | 4.8 | 81.7 | 4 |
| 1 | 9.3 | 75.5 | 9 |
| Control** | −2.3 | 101.5 | 17 |

**U.S. Pat. No. 4,923,846, Table C-2 (Example C-2), Foron Brilliant Yellow S-6GL having the structure given in Example 1.

The above results indicate that by using a mixture of the dyes according to the invention in an appropriate ratio, a hue closely corresponding to that of the yellow SWOP Color Reference was obtained, in comparison to either the control of the prior art or the individual yellow dye images which were much further away from the SWOP Color Reference.

The above results obtained by transfer of the dyes by means of a thermal head are essentially equivalent to those of Example 1 where laser dye transfer was used. This illustrates that good hue matches are obtainable by different thermal dye transfer processes.

EXAMPLE 3

Individual dye-donor elements were prepared as described in Example 1 containing mixtures of dyes illustrated below. Single color images were printed using these dye-donors using a laser imaging device onto a receiver as described in Example 1. Colorimetric comparisons of the transferred color images with the SWOP yellow color reference and similarly transferred color images containing the preferred dye of the prior art were carried out as described in Example 1 and the results are tabulated in Table 3.

TABLE 3

| Dye(s) (Wt ratio) | a* | b* | Distance From Ref. | Hue Angle* | Δ Hue Angle** |
|---|---|---|---|---|---|
| SWOP | 2.3 | 84.8 | — | 88.4 | — |
| D | 4.3 | 77.3 | 8 | 86.8 | 1.6 |
| D/e/1 (52:32:16) | 4.0 | 83.3 | 2 | 87.3 | 1.1 |
| D/e/1 (56:32:12) | 3.8 | 81.3 | 4 | 87.3 | 1.1 |
| X | 0.5 | 82.6 | 3 | 89.6 | −1.2 |
| X/e/1 (56:24:20) | 2.6 | 86.7 | 2 | 88.2 | 0.2 |
| Y | 1.2 | 80.6 | 4 | 89.2 | −0.8 |
| Y/e/1 (48:32:20) | 2.2 | 83.5 | 1 | 88.5 | −0.1 |
| HH | 0.4 | 82.4 | 3 | 89.7 | −1.3 |
| HH/e/1 | 2.3 | 85.9 | 1 | 88.5 | −0.1 |

TABLE 3-continued

| Dye(s) (Wt ratio) | a* | b* | Distance From Ref. | Hue Angle* | Δ Hue Angle** |
|---|---|---|---|---|---|
| (48:32:20) HH/b/1 | 2.5 | 84.4 | 0.4 | 88.3 | 0.1 |
| (48:32:20) HH/c/1 | 2.4 | 84.7 | 0.1 | 88.4 | 0 |
| (44:38:18) HH/d/1 | 2.6 | 85.3 | 0.6 | 88.3 | 0.1 |
| (56:20:24) HH/a/1 | 2.0 | 86.9 | 2 | 88.7 | −0.3 |
| (52:26:22) 1 | 7.2 | 79.1 | 8 | 84.8 | 3.6 |
| Control*** | −0.9 | 98.6 | 14 | 90.5 | −2.1 |

*Tan$^{-1}$(b*/a*)
**Hue angle (SWOP)-hue angle (Invention)
***U.S. Pat. No. 4,923,846, Table C-2 (Example C-2). Foron Brilliant Yellow S-6GL The above results indicate that by using a mixture of dyes according to the invention in an appropriate ratio, a hue closely corresponding to that and hue angle was obtained. In comparison, the yellow dye images from the control dye of the prior art and from the individual dyes were farther away from the reference in either or both color coordinates and/or hue angle.

The invention has been described in detail with particular reference to preferred embodiments thereof, but it will be understood that variations and modifications can be effected within the spirit and scope of the invention.

What is claimed is:

1. A yellow dye-donor element for thermal dye transfer comprising a support having thereon a dye layer comprising a mixture of yellow dyes dispersed in a polymeric binder, at least one of said yellow dyes having the formula:

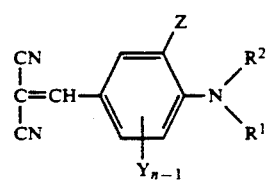

wherein:
R$^1$ is a substituted or unsubstituted alkyl group of from 1 to about 10 carbon atoms; a cycloalkyl group of from about 5 to about 7 carbon atoms; or a substituted or unsubstituted allyl group;

R$^2$ is any of the groups for R$^1$ or represents the atoms which when taken together with Z form a 5- or 6-membered ring;

Z is hydrogen; any of the groups for R$^1$; alkoxy; halogen; aryloxy; or represents the atoms which when taken together with R$^2$ forms a 5- or 6-membered ring;

Y is any of the groups for R$^1$; alkoxy of from 1 to about 10 carbon atoms; halogen; or represents the atoms necessary to complete a 5- or 6-membered ring, thus forming a fused ring system; and n is a positive integer from 1 to 3;

and at least one of the other of the dyes having the formula:

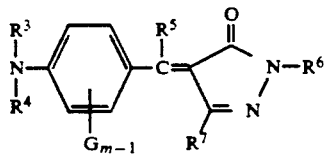

wherein
R$^6$ represents a substituted or unsubstituted alkyl group of from 1 to about 10 carbon atoms; a cycloalkyl group of from about 5 to about 7 carbon atoms; a substituted or unsubstituted allyl group; or an aryl group having from about 6 to about 10 carbon atoms;

R$^7$ represents a substituted or unsubstituted alkoxy group having from 1 to about 10 carbon atoms; a substituted or unsubstituted aryloxy group having from about 6 to about 10 carbon atoms; NHR$^8$; NR$^8$R$^9$ or the atoms necessary to complete a 6-membered ring fused to the benzene ring;

R$^3$ and R$^4$ each represents any of the groups for R$^6$; or R$^3$ and R$^4$ can be joined together to form, along with the nitrogen to which they are attached, a 5- or 6-membered heterocyclic ring; or either or both of R$^3$ and R$^4$ can be joined to the carbon atom of the benzene ring at a position ortho to the position of attachment of the anilino nitrogen to form a 5- or 6-membered ring, thus forming a polycyclic system;

R$^5$ represents hydrogen; a substituted or unsubstituted alkyl group of from 1 to about 10 carbon atoms; a cycloalkyl group of from about 5 to about 7 carbon atoms; a substituted or unsubstituted allyl group; carbamoyl; or alkoxycarbonyl;

R$^8$ and R$^9$ each independently represents any of the groups for R$^6$; or R$^8$ and R$^9$ may be joined together to form, along with the nitrogen to which they are attached, a 5- or 6-membered heterocyclic ring;

m is a positive integer from 1 to 3; and

G represents a substituted or unsubstituted alkyl or alkoxy group of from 1 to about 10 carbon atoms; halogen; aryloxy; or represents the atoms necessary to complete a 5- or 6-membered ring, thus forming a fused ring system.

2. The element of claim 1 wherein R$^2$ represents the atoms which are taken together with Z to form a 6-membered ring.

3. The element of claim 1 wherein R$^2$ is C$_2$H$_4$OCONHC$_6$H$_5$.

4. The element of claim 1 wherein R$^6$ is phenyl, R$^7$ is ethoxy or NHR$^8$, wherein R$^8$ is methyl or phenyl, m is 1 and R$^5$ is hydrogen.

5. The element of claim 1 wherein R$^7$ is O and completes a 6-membered ring fused to the benzene ring.

6. The element of claim 1 wherein R$^7$ is NR$^8$R$^9$, wherein each R$^8$ and R$^9$ is methyl or R$^8$ is ethyl and R$^9$ is phenyl.

7. The element of claim 1 wherein said dye-donor element contains an infrared-absorbing dye in said dye layer.

8. The element of claim 1 wherein R$^7$ is NR$^8$R$^9$, wherein R$^8$ and R$^9$ are joined together to form, along with the nitrogen to which they are attached, a pyrrolidine or morpholine ring.

9. The element of claim 1 wherein $R^3$ is methyl, ethyl or butyl and $R^4$ is methyl, ethyl, butyl or $CH_2CO_2CH_2CF_3$.

10. The element of claim 1 wherein $R^3$ and $R^4$ are joined together to form a pyrrolidine ring.

11. The element of claim 1 wherein Y is methyl, n is 2, Z and $R^2$ form a 6-membered ring, $R^1$ is $CH_2CH_2O_2CNHC_6H_5$, $R^3$ and $R^4$ are each $C_2H_5$, $R^5$ is hydrogen, $R^6$ is $C_6H_5$, $R^7$ is $N(CH_3)_2$ and m is 1.

12. The element of claim 1 wherein Y is methyl, n is 2, Z and $R^2$ form a 6-membered ring, $R^1$ is $C_2H_5$, $R^3$ and $R^4$ are each $C_2H_5$, $R^5$ is hydrogen, $R^6$ is $C_6H_5$, $R^7$ is $N(CH_3)_2$ and m is 1.

13. The element of claim 1 wherein Y is methyl, n is 2, Z is hydrogen, $R^1$ is $C_2H_5$, $R^2$ is $C_2H_4O_2CNHC_6H_5$, $R^3$ and $R^4$ are each $C_2H_5$, $R^5$ is hydrogen, $R^6$ is $C_6H_5$, $R^7$ is $N(CH_3)_2$ and m is 1.

14. The element of claim 1 wherein Y is methyl, n is 2, Z and $R^2$ form a 6-membered ring, $R^1$ is $CH_2CH_2O_2CNHC_6H_5$, $R^3$ is $C_2H_5$, $R^4$ is $CH_2C_6H_5$, G is methyl, $R^5$ is hydrogen, $R^6$ is $C_6H_5$, $R^7$ is $OC_2H_5$ and m is 2.

15. The element of claim 1 wherein Y is methyl, n is 2, Z and $R^2$ form a 6-membered ring, $R^1$ is $CH_2CH_2O_2CNHC_6H_5$, $R^3$ and $R^4$ are each $C_2H_5$, $R^5$ is hydrogen, $R^6$ is $C_6H_5$, $R^7$ is $OC_3H_7$-i, and m is 1.

16. The element of claim 1 wherein a third yellow dye is employed having the formula:

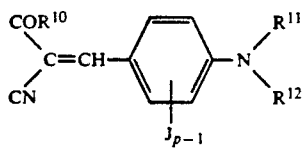

wherein:
$R^{10}$ represents $OR^{13}$ or $NHR^{13}$;
$R^{11}$ represents any of the groups for $R^3$;
$R^{12}$ represents any of the groups for $R^4$;
$R^{13}$ represents any of the groups for $R^6$;
J represents any of the groups for G; and
p is a positive integer from 1 to 3.

17. In a process of forming a dye transfer image comprising imagewise-heating a yellow dye-donor element comprising a support having thereon a dye layer comprising a mixture of yellow dyes dispersed in a polymeric binder and transferring a yellow dye image to a dye-receiving element to form said yellow dye transfer image, the improvement wherein at least one of said yellow dyes has the formula:

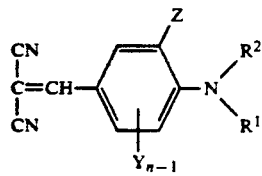

wherein:
$R^1$ is a substituted or unsubstituted alkyl group of from 1 to about 10 carbon atoms; a cycloalkyl group of from about 5 to about 7 carbon atoms; or a substituted or unsubstituted allyl group;
$R^2$ is any of the groups for $R^1$ or represents the atoms which when taken together with Z form a 5- or 6-membered ring;

Z is hydrogen; any of the groups for $R^1$; alkoxy; halogen; aryloxy; or represents the atoms which when taken together with $R^2$ forms a 5- or 6-membered ring;
Y is any of the groups for $R^1$; alkoxy of from 1 to about 10 carbon atoms; halogen; or represents the atoms necessary to complete a 5- or 6-membered ring, thus forming a fused ring system; and
n is a positive integer from 1 to 3;
and at least one of the other of the dyes having the formula:

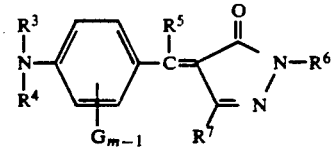

wherein:
$R^6$ represents a substituted or unsubstituted alkyl group of from 1 to about 10 carbon atoms; a cycloalkyl group of from about 5 to about 7 carbon atoms; a substituted or unsubstituted allyl group; or an aryl group having from about 6 to about 10 carbon atoms;
$R^7$ represents a substituted or unsubstituted alkoxy group having from 1 to about 10 carbon atoms; a substituted or unsubstituted aryloxy group having from about 6 to about 10 carbon atoms; $NHR^8$; $NR^8R^9$ or the atoms necessary to complete a 6-membered ring fused to the benzene ring;
$R^3$ and $R^4$ each represents any of the groups for $R^6$; or $R^3$ and $R^4$ can be joined together to form, along with the nitrogen to which they are attached, a 5-or 6-membered heterocyclic ring; or either or both of $R^3$ and $R^4$ can be joined to the carbon atom of the benzene ring at a position ortho to the position of attachment of the anilino nitrogen to form a 5- or 6-membered ring, thus forming a polycyclic system;
$R^5$ represents hydrogen; a substituted or unsubstituted alkyl group of from 1 to about 10 carbon atoms; a cycloalkyl group of from about 5 to about 7 carbon atoms; a substituted or unsubstituted allyl group; carbamoyl; or alkoxycarbonyl;
$R^8$ and $R^9$ each independently represents any of the groups for $R^6$; or $R^8$ and $R^9$ may be joined together to form, along with the nitrogen to which they are attached, a 5-or 6-membered heterocyclic ring;
m is a positive integer from 1 to 3; and
G represents a substituted or unsubstituted alkyl or alkoxy group of from 1 to about 10 carbon atoms; halogen; aryloxy; or represents the atoms necessary to complete a 5- or 6-membered ring, thus forming a fused ring system.

18. The process of claim 17 wherein a third yellow dye is employed having the formula:

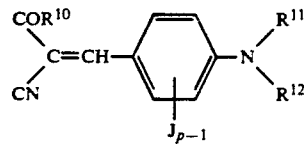

wherein:
$R^{10}$ represents $OR^{13}$ or $NHR^{13}$;

$R^{11}$ represents any of the groups for $R^3$;
$R^{12}$ represents any of the groups for $R^4$;
$R^{13}$ represents any of the groups for $R^6$;
J represents any of the groups for G; and
p is a positive integer from 1 to 3.

19. In a thermal dye transfer assemblage comprising:
a) a yellow dye-donor element comprising a support having thereon a dye layer comprising a mixture of yellow dyes dispersed in a polymeric binder, and
b) a dye-receiving element comprising a support having thereon a dye image-receiving layer, said dye-receiving element being in a superposed relationship with said yellow dye-donor element so that said dye layer is in contact with said dye image-receiving layer, the improvement wherein at least one of said yellow dyes has the formula:

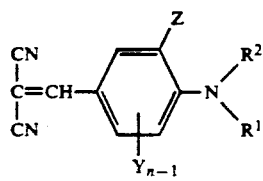
  I wherein:
$R^1$ is a substituted or unsubstituted alkyl group of from 1 to about 10 carbon atoms; a cycloalkyl group of from about 5 to about 7 carbon atoms; or a substituted or unsubstituted allyl group;
$R^2$ is any of the groups for $R^1$ or represents the atoms which when taken together with Z form a 5- or 6-membered ring;
Z is hydrogen; any of the groups for $R^1$; alkoxy; halogen; aryloxy; or represents the atoms which when taken together with $R^2$ forms a 5- or 6-membered ring;
Y is any of the groups for $R^1$; alkoxy of from 1 to about 10 carbon atoms; halogen; or represents the atoms necessary to complete a 5- or 6-membered ring, thus forming a fused ring system; and
n is a positive integer from 1 to 3;
and at least one of the other of the dyes having the formula:

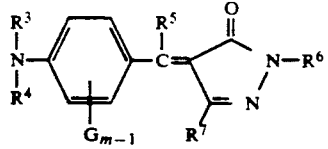
  II wherein:
$R^6$ represents a substituted or unsubstituted alkyl group of from 1 to about 10 carbon atoms; a cycloalkyl group of from about 5 to about 7 carbon atoms; a substituted or unsubstituted allyl group; or an aryl group having from about 6 to about 10 carbon atoms;
$R^7$ represents a substituted or unsubstituted alkoxy group having from 1 to about 10 carbon atoms; a substituted or unsubstituted aryloxy group having from about 6 to about 10 carbon atoms; $NHR^8$; $NR^8R^9$ or the atoms necessary to complete a 6-membered ring fused to the benzene ring;
$R^3$ and $R^4$ each represents any of the groups for $R^6$; or $R^3$ and $R^4$ can be joined together to form, along with the nitrogen to which they are attached, a 5-or 6-membered heterocyclic ring; or ether or both of $R^3$ and $R^4$ can be joined to the carbon atom of the benzene ring at a position ortho to the position of attachment of the anilino nitrogen to form a 5- or 6-membered ring, thus forming a polycyclic system;
$R^5$ represents hydrogen; a substituted or unsubstituted alkyl group of from 1 to about 10 carbon atoms; a cycloalkyl group of from about 5 to about 7 carbon atoms; a substituted or unsubstituted allyl group; carbamoyl; or alkoxycarbonyl;
$R^8$ and $R^9$ independently represents any of the groups for $R^6$; or $R^8$ and $R^9$ may be joined together to form, along with the nitrogen to which they are attached, a 5-or 6-membered heterocyclic ring;
m is a positive integer from 1 to 3; and
G represents a substituted or unsubstituted alkyl or alkoxy group of from 1 to about 10 carbon atoms; halogen; aryloxy; or represents the atoms necessary to complete a 5- or 6-membered ring, thus forming a fused ring system.

20. The assemblage of claim 19 wherein a third yellow dye is employed having the formula:

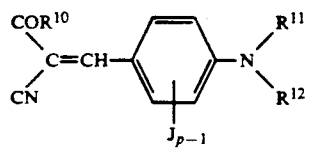
  III wherein:
$R^{10}$ represents $OR^{13}$ or $NHR^{13}$;
$R^{11}$ represents any of the groups for $R^3$;
$R^{12}$ represents any of the groups for $R^4$;
$R^{13}$ represents any of the groups for $R^6$;
J represents any of the groups for G; and
p is a positive integer from 1 to 3.

* * * * *